US009059379B2

(12) United States Patent
Kuo et al.

(10) Patent No.: US 9,059,379 B2
(45) Date of Patent: Jun. 16, 2015

(54) LIGHT-EMITTING SEMICONDUCTOR PACKAGES AND RELATED METHODS

(71) Applicant: Advanced Semiconductor Engineering, Inc., Kaohsiung (TW)

(72) Inventors: Yen-Ting Kuo, Tainan (TW); Ping-Cheng Hu, Kaohsiung (TW); Yu-Fang Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/663,016

(22) Filed: Oct. 29, 2012

(65) Prior Publication Data

US 2014/0117388 A1 May 1, 2014

(51) Int. Cl.

| | |
|---|---|
| ***H01L 33/00*** | (2010.01) |
| ***H01L 33/48*** | (2010.01) |
| ***H01L 33/54*** | (2010.01) |
| *H01L 33/62* | (2010.01) |

(52) U.S. Cl.

CPC ............... *H01L 33/486* (2013.01); *H01L 33/62* (2013.01); *H01L 2224/48091* (2013.01); *H01L 2224/48247* (2013.01); *H01L 33/54* (2013.01); *H01L 2933/0033* (2013.01)

(58) Field of Classification Search

CPC ........... H01L 2224/48091; H01L 2924/00014; H01L 2224/48247; H01L 2933/0033; H01L 33/486; H01L 33/54; H01L 33/62

USPC .................. 257/99, 666, 720, 676, 684, 690; 438/118

See application file for complete search history.

(56) References Cited

U.S. PATENT DOCUMENTS

| | | | |
|---|---|---|---|
| 5,847,458 | A | 12/1998 | Nakamura et al. |
| 6,001,671 | A | 12/1999 | Fjelstad |
| 6,238,952 | B1 | 5/2001 | Lin |

(Continued)

FOREIGN PATENT DOCUMENTS

| | | |
|---|---|---|
| CN | 101442035 | 5/2009 |
| CN | 101540309 | 9/2009 |

(Continued)

OTHER PUBLICATIONS

Feng et al.; "Packaging and AC Powering of LED Array", Electronic Components and Technology Conference (ECTC), 2010 Proceedings 60th, 512, (Jun. 2010).

(Continued)

*Primary Examiner* — Mohammed Shamsuzzaman

(74) *Attorney, Agent, or Firm* — Klein, O'Neill & Singh, LLP

(57) ABSTRACT

Light-emitting semiconductor packages and related methods. The light-emitting semiconductor package includes a central barrier, a plurality of leads, a light-emitting device, a first encapsulant, a package body, and a second encapsulant. The light-emitting device is disposed in the interior space defined by the central barrier and is electrically connected to the leads surrounding the central barrier. The light-emitting device includes upper and lower light-emitting surfaces. The first encapsulant and the second encapsulant cover the upper and lower light-emitting surfaces, respectively. The package body encapsulates portions of the central barrier, portions of each of the leads, and the first encapsulant. The light-emitting semiconductor package can emit light from both the upper and lower sides thereof.

19 Claims, 10 Drawing Sheets

(56) References Cited

U.S. PATENT DOCUMENTS

| | | | | |
|---|---|---|---|---|
| 6,242,284 | B1 | 6/2001 | Kang et al. | |
| 6,261,864 | B1 | 7/2001 | Jung et al. | |
| 6,291,271 | B1 | 9/2001 | Lee et al. | |
| 6,306,685 | B1 | 10/2001 | Liu et al. | |
| 6,333,252 | B1 | 12/2001 | Jung et al. | |
| 6,342,730 | B1 | 1/2002 | Jung et al. | |
| 6,348,726 | B1 | 2/2002 | Bayan et al. | |
| 6,400,004 | B1 | 6/2002 | Fan et al. | |
| 6,451,627 | B1 | 9/2002 | Coffman | |
| 6,495,909 | B2 | 12/2002 | Jung et al. | |
| 6,498,099 | B1 | 12/2002 | McLellan et al. | |
| 6,528,893 | B2 | 3/2003 | Jung et al. | |
| 6,534,330 | B2 | 3/2003 | Sakamoto et al. | |
| 6,545,347 | B2 | 4/2003 | McClellan | |
| 6,586,677 | B2 | 7/2003 | Glenn | |
| 6,658,734 | B2 | 12/2003 | Yamada et al. | |
| 6,664,615 | B1 | 12/2003 | Bayan et al. | |
| 6,700,188 | B2 * | 3/2004 | Lin | 257/684 |
| 6,770,498 | B2 | 8/2004 | Hsu | |
| 6,791,116 | B2 * | 9/2004 | Hirano et al. | 257/79 |
| 6,812,552 | B2 | 11/2004 | Islam et al. | |
| 6,861,295 | B2 | 3/2005 | Jung et al. | |
| 6,927,096 | B2 * | 8/2005 | Shimanuki | 438/113 |
| 6,967,395 | B1 | 11/2005 | Glenn et al. | |
| 6,993,594 | B2 | 1/2006 | Schneider | |
| 6,995,459 | B2 | 2/2006 | Lee et al. | |
| 6,995,510 | B2 | 2/2006 | Murakami et al. | |
| 7,049,177 | B1 | 5/2006 | Fan et al. | |
| 7,098,588 | B2 | 8/2006 | Jäger et al. | |
| 7,125,798 | B2 | 10/2006 | Sakamoto et al. | |
| 7,128,442 | B2 | 10/2006 | Lee et al. | |
| 7,183,630 | B1 | 2/2007 | Fogelson et al. | |
| 7,247,526 | B1 | 7/2007 | Fan et al. | |
| 7,271,032 | B1 | 9/2007 | McLellan et al. | |
| 7,297,293 | B2 | 11/2007 | Tamaki et al. | |
| 7,301,175 | B2 * | 11/2007 | Izuno et al. | 257/98 |
| 7,372,198 | B2 | 5/2008 | Negley | |
| 7,608,930 | B2 | 10/2009 | Kasuya et al. | |
| 7,663,095 | B2 | 2/2010 | Wong et al. | |
| 7,683,461 | B2 | 3/2010 | Lau | |
| 7,695,990 | B2 | 4/2010 | Sorg et al. | |
| 7,807,498 | B2 | 10/2010 | Shoji et al. | |
| 8,044,420 | B2 | 10/2011 | Lee et al. | |
| 8,125,062 | B2 | 2/2012 | Shoji et al. | |
| 8,377,750 | B2 | 2/2013 | Camacho et al. | |
| 2003/0006055 | A1 | 1/2003 | Chien-Hung et al. | |
| 2004/0084681 | A1 | 5/2004 | Roberts | |
| 2005/0247944 | A1 | 11/2005 | Haque et al. | |
| 2006/0118807 | A1 | 6/2006 | Ives et al. | |
| 2007/0018291 | A1 | 1/2007 | Huang et al. | |
| 2007/0052076 | A1 | 3/2007 | Ramos et al. | |
| 2007/0059863 | A1 | 3/2007 | Li et al. | |
| 2007/0085199 | A1 | 4/2007 | Ong et al. | |
| 2007/0181983 | A1 * | 8/2007 | Takai et al. | 257/666 |
| 2008/0062701 | A1 | 3/2008 | Harrah et al. | |
| 2008/0067649 | A1 | 3/2008 | Matsunaga et al. | |
| 2008/0121921 | A1 | 5/2008 | Loh et al. | |
| 2008/0194061 | A1 | 8/2008 | Medendorp | |
| 2008/0217637 | A1 | 9/2008 | Kim et al. | |
| 2008/0258278 | A1 | 10/2008 | Ramos et al. | |
| 2009/0001869 | A1 | 1/2009 | Tanimoto et al. | |
| 2010/0044843 | A1 | 2/2010 | Chang Chien et al. | |
| 2010/0270571 | A1 | 10/2010 | Seo | |
| 2011/0073896 | A1 | 3/2011 | Xu | |
| 2011/0278609 | A1 | 11/2011 | Jeong et al. | |
| 2011/0278610 | A1 | 11/2011 | Jeong et al. | |

FOREIGN PATENT DOCUMENTS

| | | |
|---|---|---|
| CN | 102044510 | 5/2011 |
| JP | 5166985 | 7/1993 |
| JP | 11195733 | 7/1999 |
| JP | 2001024135 | 1/2001 |

OTHER PUBLICATIONS

Jordan et al.; "Optimized heat transfer and homogeneous color converting for ultra high brightness LED package," Proc. SPIE 6198, 61980B (2006).

Lai et al.; "Development and performance charaterizations of a QFN/HMT package"; Electronic Components and Technology Conference; pp. 964-967 (2008).

* cited by examiner

LIGHT-EMITTING SEMICONDUCTOR PACKAGES AND RELATED METHODS

TECHNICAL FIELD

The present embodiments relate to light-emitting semiconductor packages and related methods.

BACKGROUND

Light-emitting diodes (LEDs) are used in illumination apparatus and provide high emitting efficiency, small size, and electricity savings. However, conventional LED packages typically can emit light from only one side. Thus, applications for conventional LED packages are limited.

SUMMARY

One of the present embodiments comprises a light-emitting semiconductor package. The light-emitting semiconductor package comprises a central barrier defining an interior space and a plurality of leads surrounding the central barrier, and electrically isolated from each other. A light-emitting device is disposed in the interior space and has an upper light-emitting surface and a lower light-emitting surface. The light-emitting device is electrically connected to the central barrier and/or the leads. A first encapsulant covers the upper light-emitting surface of the light-emitting device. A package body encapsulates portions of the central barrier, portions of each of the leads, and the first encapsulant. A second encapsulant covers the lower light-emitting surface of the light-emitting device. The first and second encapsulants are located within the interior space and laterally restricted by the central barrier.

Another of the present embodiments comprises a light-emitting semiconductor package. The light-emitting semiconductor package comprises a central barrier defining an interior space and a plurality of leads surrounding the central barrier, and electrically isolated from each other. A light-emitting device is disposed in the interior space and has an upper light-emitting surface and a lower light-emitting surface. The light-emitting device is electrically connected to the central barrier and/or the leads. A first phosphorescent material covers the upper light-emitting surface of the light-emitting device. A package body encapsulates portions of the central barrier, portions of each of the leads, and the first phosphorescent material. A second phosphorescent material covers the lower light-emitting surface of the light-emitting device.

Another of the present embodiments comprises a method of making a light-emitting semiconductor package. The method comprises forming an upper metal layer and a lower metal layer on an upper surface and a lower surface of an electrically conductive core, respectively. The upper metal layer has an upper pattern to expose portions of the upper surface of the core, and the lower metal layer has a lower pattern to expose portions of the lower surface of the core. The method further comprises performing a half etching process on the upper surface of the core without the upper metal layer formed thereon so as to form a central protrusion and a plurality of peripheral protrusions. The central protrusion defines a cavity, and the peripheral protrusions are disposed around the central protrusion. The method further comprises attaching a light-emitting device to a bottom of the cavity. The light-emitting device has an upper light-emitting surface and a lower light-emitting surface. The method further comprises electrically connecting the light-emitting device to the central protrusion and/or the peripheral protrusions. The method further comprises forming a first encapsulant in the cavity to cover the upper light-emitting surface of the light-emitting device. The method further comprises forming a package body over the core so as to cover the first encapsulant. the central protrusion, and the peripheral protrusions. The method further comprises etching the lower surface of the core without the lower metal formed thereon so as to form a central barrier and a plurality of leads. The central barrier defines an interior space, and the leads surround the central barrier and are electrically isolated from each other. The method further comprises forming a second encapsulant in the interior space to cover the lower light-emitting surface of the light-emitting device.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
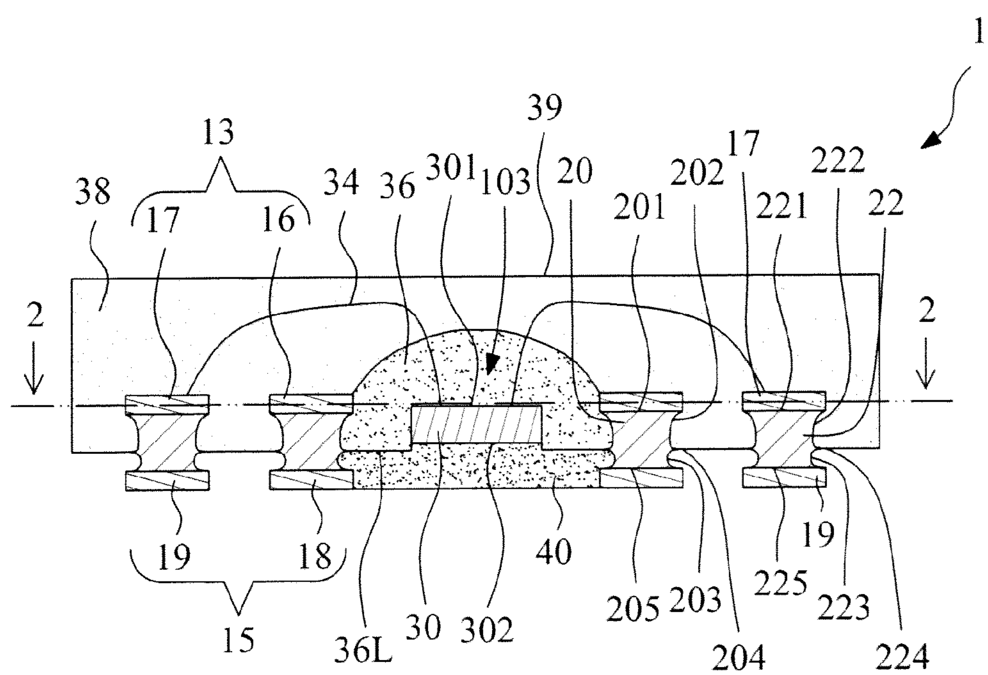
FIG. 1 is a cross-sectional side view of a light-emitting semiconductor package according to one of the present embodiments.

Referring to FIG. 1, a cross-sectional side view of a light-emitting semiconductor package according to one of the present embodiments is illustrated. The light-emitting semiconductor package 1 comprises a central barrier 20, a plurality of leads 22, an upper metal layer 13, a lower metal layer 15, a light-emitting device 30, a plurality of bonding wires 34, a first encapsulant 36, a package body 38, and a second encapsulant 40.

The central barrier 20 includes a conductive core 10 (may also be referred to as a plate 10, FIG. 6) and finishing layers 16, 18. The core 10, which may be copper or a copper alloy, includes an upper surface 201, an upper sloped portion 202, a lower sloped portion 203, a peak 204 at the junction of the upper and lower sloped portions 202, 203, and a lower surface 205. The upper sloped portion 202 is disposed adjacent to the upper surface 201, and may be linear or curved. The upper sloped portion 202 is typically non-perpendicular to the upper surface 201. The lower sloped portion 203 is disposed adjacent to the lower surface 205, and may be linear or curved. The lower sloped portion 203 is typically non-perpendicular to the lower surface 205. The upper sloped portion 202 and the lower sloped portion 203 meet at the peak 204.

The leads 22 surround the central barrier 20, and are electrically isolated from each other. In the illustrated embodiment, each of the leads 22 comprises the core 10 and finishing layers 17, 19. The leads 22 include an upper surface 221, an upper sloped portion 222, a lower sloped portion 223, a peak 224 at the junction of the upper and lower sloped portions 222, 223, and a lower surface 225. The upper sloped portion 222 is disposed adjacent to the upper surface 221, and may be linear or curved. The upper sloped portion 222 is typically non-perpendicular to the upper surface 221. The lower sloped portion 223 is disposed adjacent to the lower surface 225, and may be linear or curved. The lower sloped portion 223 is typically non-perpendicular to the lower surface 225. The upper sloped portion 222 and the lower sloped portion 223 meet at the peak 224. In the illustrated embodiment, the width of the upper surface 201 of the central barrier 20 is equal to that of the upper surface 221 of each lead 22. However, in other embodiment, the width of the upper surface 201 of the central barrier 20 may be greater or less than that of the upper surface 221 of each lead 22.

The upper metal layer 13 is disposed on the upper surface 201 of the central barrier 20 and the upper surface 221 of each of the leads 22. The lower metal layer 15 is disposed on the lower surface 205 of the central barrier 20 and the lower surface 225 of each of the leads 22. In the illustrated embodiment, the upper metal layer 13 has a first upper metal portion 16 disposed on the upper surface 201 of the central barrier 20, and a plurality of second upper metal portions 17 disposed on the upper surface 221 of each of the leads 22. The lower metal layer 15 has a first lower metal portion 18 disposed on the lower surface 205 of the central barrier 20, and a plurality of second lower metal portions 19 disposed on the lower surface 225 of each of the leads 22. The upper and lower metal layers 13, 15 can be applied using techniques such as electrolytic plating, electroless plating, or any other technique. While not shown in FIG. 1, in certain embodiments the upper and lower metal layers 13, 15 may include a layer of nickel in contact with the surfaces 201, 205, 221, 225, and a layer of gold or palladium covering the layer of nickel. Alternatively, the upper and lower metal layers 13, 15 may include a layer of an alloy of nickel and a layer of either one of, or both, gold and palladium. It is desirable that the upper and lower metal layers 13, 15 adheres well and enables effective wire bonding with the bonding wires 34.

The light-emitting device 30 is disposed generally in a central area of the central barrier 20, and has an upper light-emitting surface 301 facing upwardly and a lower light-emitting surface 302 facing downwardly. The light-emitting device 30 may be electrically connected to the central barrier 20, or the leads 22, or both. In the illustrated embodiment, the upper light-emitting surface 301 of the light-emitting device 30 is electrically connected to the second upper metal portions 17 and the leads 22 through the bonding wires 34. The light-emitting device 30 may be, for example, a light-emitting diode (LED), and the light-emitting semiconductor package 1 may be an LED package.

The first encapsulant 36 is disposed in an interior space 103 surrounded by, and laterally restricted by, the central barrier 20. The first encapsulant 36 is located generally above and surrounding the light-emitting device 30. The first encapsulant 36 encapsulates the upper light-emitting surface 301 (i.e., the top surface) of the light-emitting device 30 and first portions of each of the bonding wires 34. In the illustrated embodiment, a lower surface 36L of the first encapsulant 36 is at a different elevation than the lower light-emitting surface 302 of the light-emitting device 30. The lower light-emitting surface 302 is exposed from and recessed beneath the lower surface 36L due to the removal of an adhesive layer 32 (FIG. 11) in the manufacturing process, as described below. As a result, the second encapsulant 40 contacts the lower light-emitting surface 302 of the light-emitting device 30. Thus, the light from the lower light-emitting surface 302 of the light-emitting device 30 enters the second encapsulant 40 directly without blocking or filtering by the adhesive layer 32, thereby increasing light emission efficiency.

The first encapsulant 36 may be a silicone-based or epoxy resin, and includes particles of a light-converting substance, for example, phosphor. Light, for example, blue light, emitted from the light-emitting device 30 may be converted by the light-converting substance into light of different colors, for example, green, yellow, or red, and the lights of different colors are mixed to generate white light. The volume percentage of the phosphor in the first encapsulant 36 is defined as a first volume percentage, as discussed further below.

The package body 38 encapsulates second portions of each of the bonding wires 34, an upper part of the central barrier 20, an upper part of each of the leads 22, and the first encapsulant 36. The material of the package body 38 may be any transparent encapsulant material, such as silicone-based or epoxy resins. If the light-emitting device 30 is, for example, a high power LED chip, a silicone-based molding material is preferred for its resistance to yellowing. If the light-emitting device 30 is a general LED chip, an epoxy based molding material is harder and provides better adhesion. In the illustrated embodiment, the upper sloped portion 202 of the central barrier 20 (on the side opposite the interior space 103) and the upper sloped portions 222 of the leads 22 are embedded in the package body 38, and the lower sloped portion 203 of the central barrier 20 and the lower sloped portions 223 of the leads 22 protrude from the package body 38.

The second encapsulant 40 is disposed in the interior space 103, generally beneath the light-emitting device 30, and laterally restricted by the central barrier 20. The second encapsulant 40 covers the lower light-emitting surface 302 of the light-emitting device 30. In the illustrated embodiment, the second encapsulant 40 fills the space bounded by the lower sloped portion 203 of the central barrier 20, the first encapsulant 36, and the light-emitting device 30, so that the second encapsulant 40 contacts the first encapsulant 36 and the lower light-emitting surface 302 (i.e., the bottom surface) of the light-emitting device 30. The second encapsulant 40 may be a silicone-based or epoxy resin including phosphor, so as to produce a desired light color. The volume percentage of the phosphor in the second encapsulant 40 is defined as a second volume percentage, as discussed further below. The composition of the second encapsulant 40 may be similar to or different from the composition of the first encapsulant 36.

To achieve a substantially uniform white emission from the encapsulants 36, 40. the volume percentage of phosphor therein may be adjusted based on the thicknesses of the encapsulants 36. 40, the intensity of the light from the light-emitting surfaces 301, 302. and the phosphor's luminance (if different phosphors are used). For example, when the phosphor in the second encapsulant 40 is the same as that in the first encapsulant 36, and the intensities of the light from the light-emitting surfaces 301, 302 are the same, then the first volume percentage of the phosphor in the first encapsulant 36 may be less than the second volume percentage of the phosphor in the second encapsulant 40, because the first encapsulant 36 is significantly thicker than the second encapsulant 40.

Figure 2:
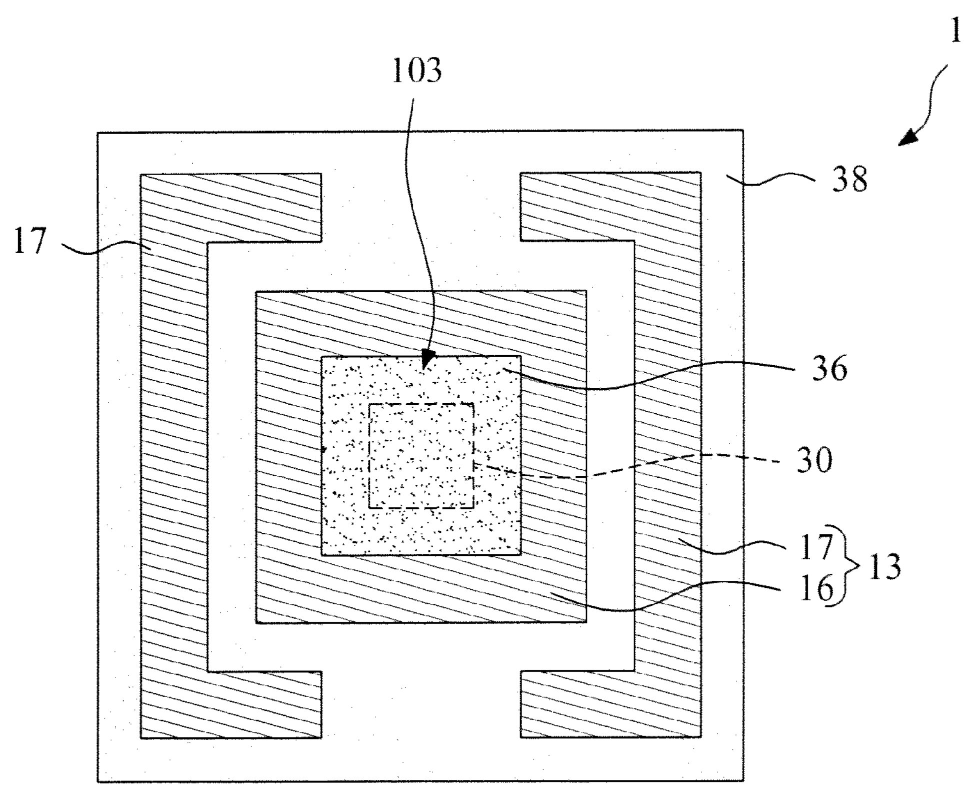
FIG. 2 is a cross-sectional top view of the package of FIG. 1 taken along the line 2-2 in FIG. 1.
Figure 3:
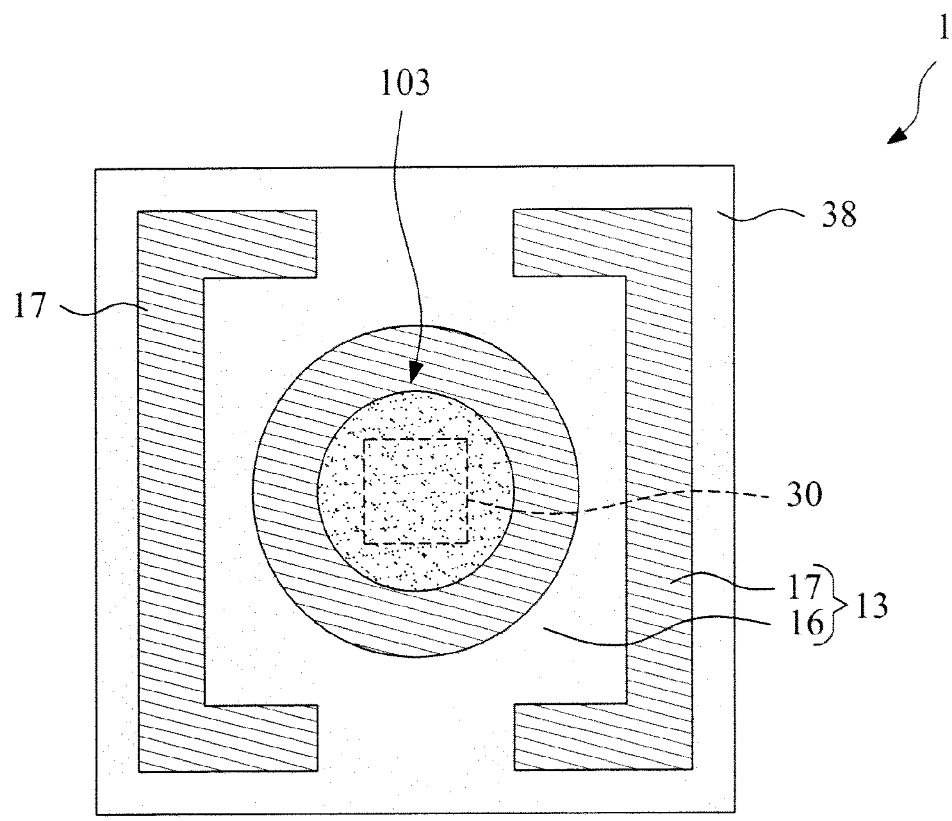
FIG. 3 is an alternative configuration for the package of FIG. 2.

Referring to FIG. 2, the central barrier 20 is a continuous ring, which provides mechanical strength and contains the two encapsulants 36, 40. More specifically, the central barrier 20 is a rectangular (square) ring. Alternatively, the central barrier 20 may be a circular ring (FIG. 3) to meet specific optical design considerations. Regardless. the central barrier 20 completely surrounds the interior space 103. However, in alternative embodiments the first upper metal portion 16 and the central barrier 20 may be discontinuous and may only partially surround the interior space 103. In the illustrated embodiment (FIG. 2), each of the second upper metal portions 17 and the leads 22 there below is U-shaped. One of the leads 22 and the second upper metal portions 17 may be used for power, and the other of the leads 22 and the second upper metal portions 17 may be used for grounding. In addition, the first upper metal portion 16 and the second upper metal portions 17 of the upper metal layer 13 may be defined as an upper pattern. Further, the first lower metal portion 18 and the second lower metal portions 19 of the lower metal layer 15 may be defined as a lower pattern. In the illustrated embodiment. the upper pattern of the upper metal layer 13 is the same as the lower pattern of the lower metal layer 15. Advantageously, the light-emitting semiconductor package 1 can emit light from two opposing sides, so that its light-emitting angle is significantly greater than conventional packages.

Figure 4:
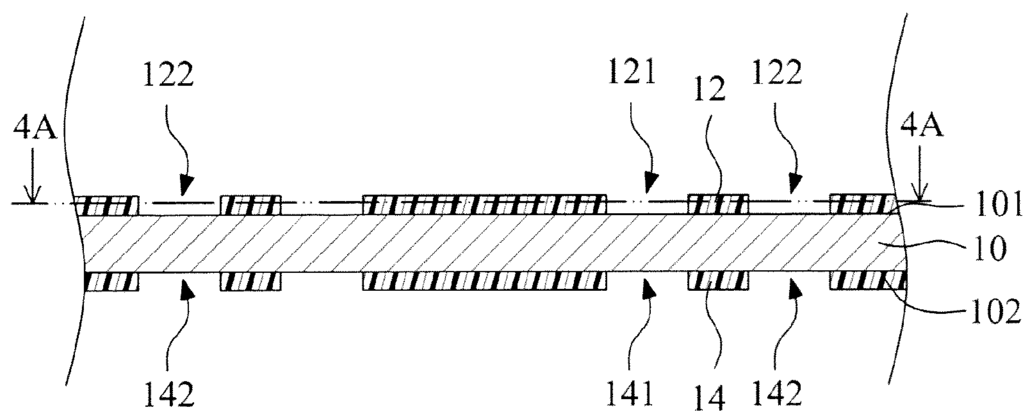
FIGS. 4-13 illustrate steps in a method of making a light-emitting semiconductor package according to one of the present embodiments.

Referring to FIGS. 4-13, steps in a method of making a light-emitting semiconductor package according to one of the present embodiments are illustrated. With reference to FIG. 4, a first photoresist layer 12 is applied on an upper surface 101 of a core 10, and a second photoresist layer 14 is applied on a lower surface 102 of the core 10. The material of the core 10 may be copper, a copper alloy, or any other electrically conductive material. The photoresist layers 12, 14 may be formed by coating, printing, or any other suitable technique. Then, the photoresist layers 12, 14 are patterned so that the first photoresist layer 12 has a plurality of first openings 121, 122 to expose portions of the upper surface 101 of the core 10, and the second photoresist layer 14 has a plurality of second openings 141, 142 to expose portions of the lower surface 102 of the core 10. The patterning may comprise photolithography, for example, or any other suitable technique.

Figure 4A:
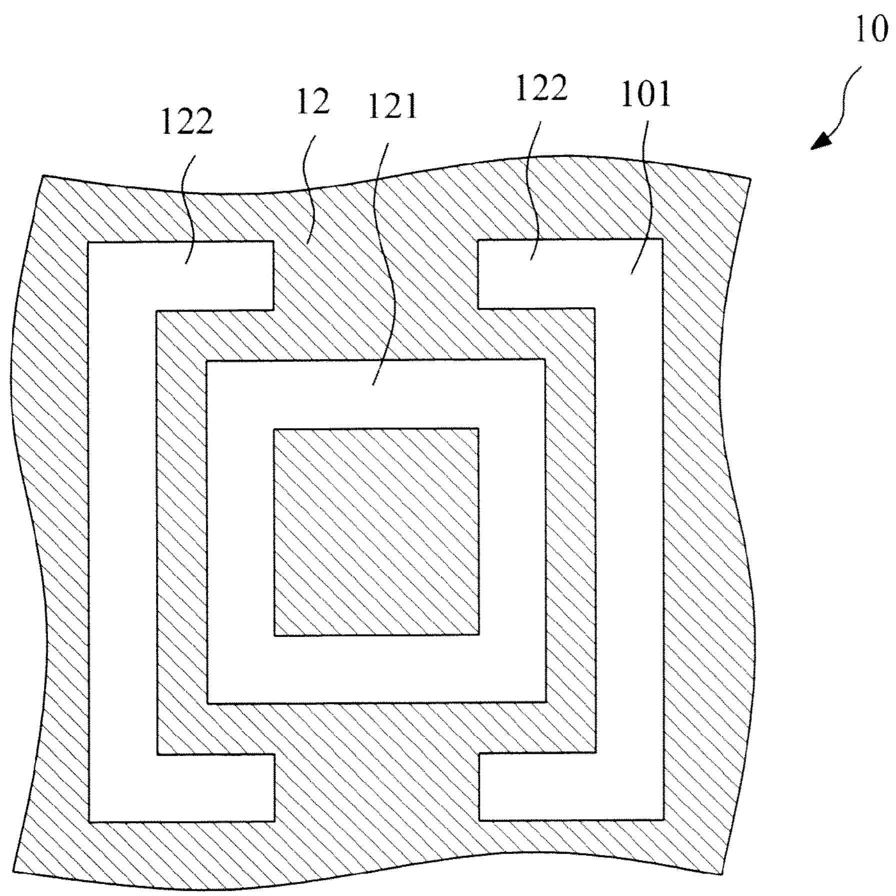

FIG. 4A is a top plan view of FIG. 4. In the illustrated embodiment, the first opening 121 is shaped as a continuous ring. However, in other embodiments, the first opening 121 may be discontinuous. Specifically, the first opening 121 is shaped as a rectangular (square) ring. Alternatively, the first opening 121 may be shaped as a circular ring. In the illustrated embodiment, each of the first openings 122 is U-shaped, and the first openings 122 are not connected with each other.

Figure 5:
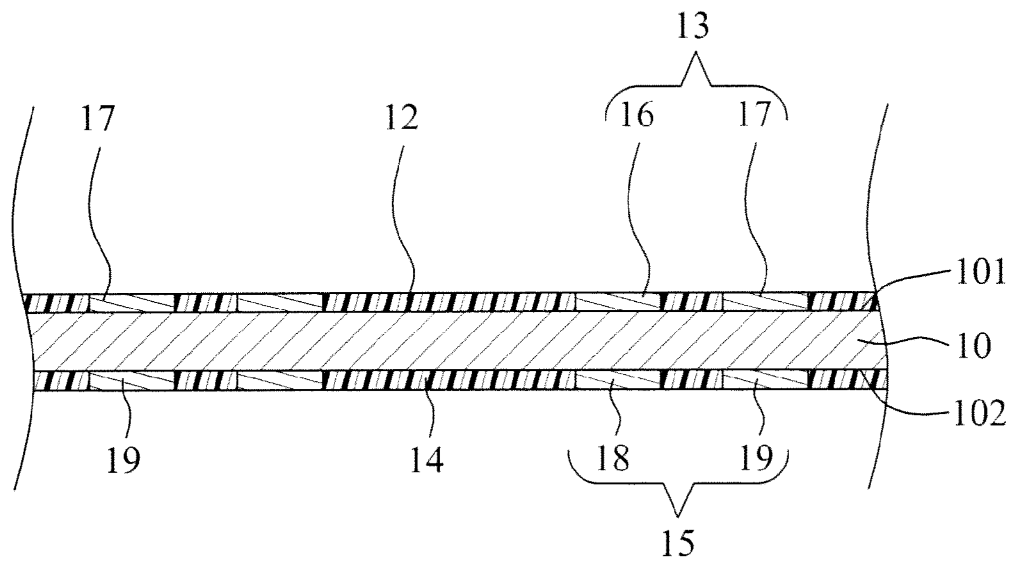
Figure 6:
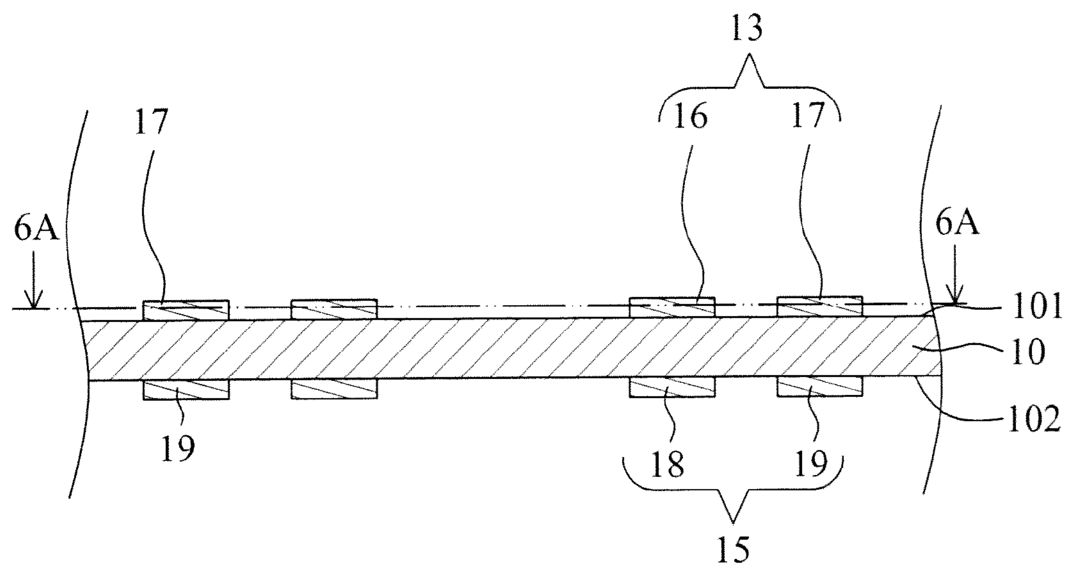
Figure 6A:
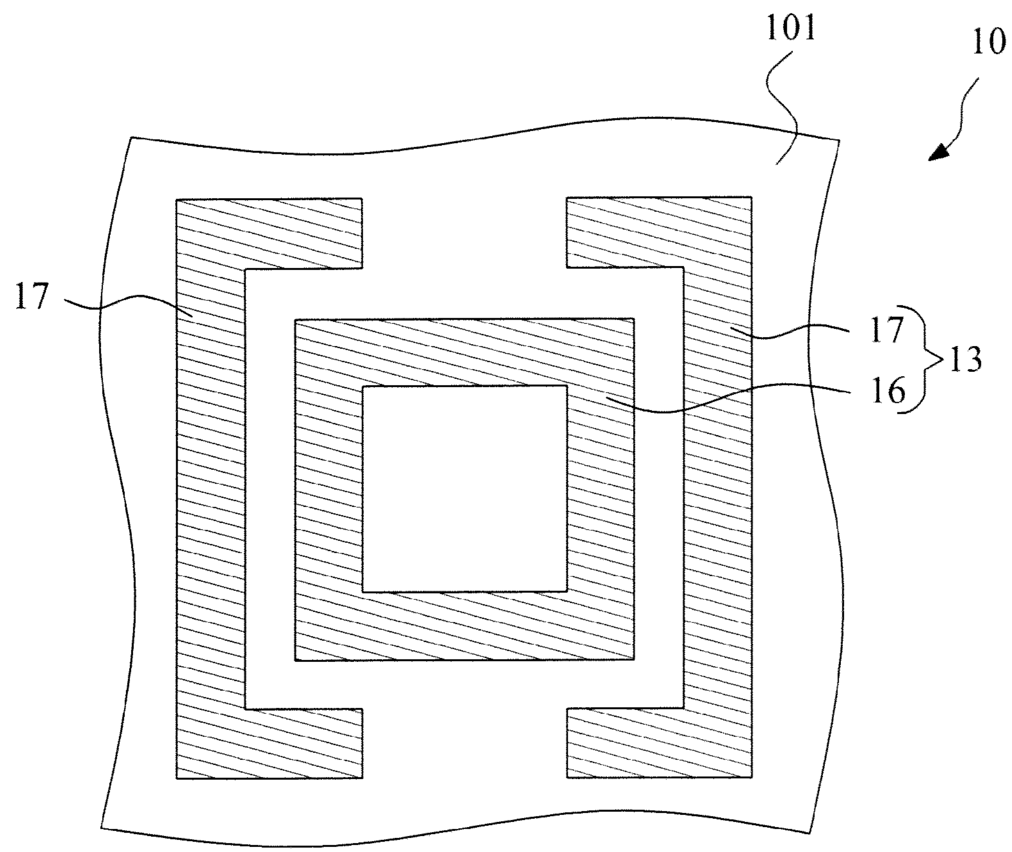

With reference to FIG. 5. the upper metal layer 13 is formed in the first openings 121, 122, and the lower metal layer 15 is formed in the second openings 141, 142. With reference to FIGS. 6 and 6A, where FIG. 6A is a top plan view of FIG. 6, the first photoresist layer 12 and the second photoresist layer 14 are stripped. Therefore, the upper metal layer 13 has an upper pattern to expose portions of the upper surface 101 of the core 10, and the lower metal layer 15 has a lower pattern to expose portions of the lower surface 102 of the core 10. In the illustrated embodiment. the upper pattern of the upper metal layer 13 includes the first upper metal portion 16 previously disposed in the first opening 121 (FIGS. 4 and 4A), and a plurality of second upper metal portions 17 previously disposed in the first openings 122 (FIGS. 4 and 4A). The lower pattern of the lower metal layer 15 includes the first lower metal portion 18 previously disposed in the second opening 141, and a plurality of second lower metal portions 19 previously disposed in the second openings 142. That is, the upper pattern corresponds to the first openings 121, 122, and the lower pattern corresponds to the second openings 141, 142. The first upper metal portion 16 and the first lower metal portion 18 are both shaped as a continuous ring. The second upper metal portions 17 do not connect to one another, and the second lower metal portions 19 do not connect to one another. In the illustrated embodiment. the upper pattern of the upper metal layer 13 is the same as the lower pattern of the lower metal layer 15.

Figure 7:
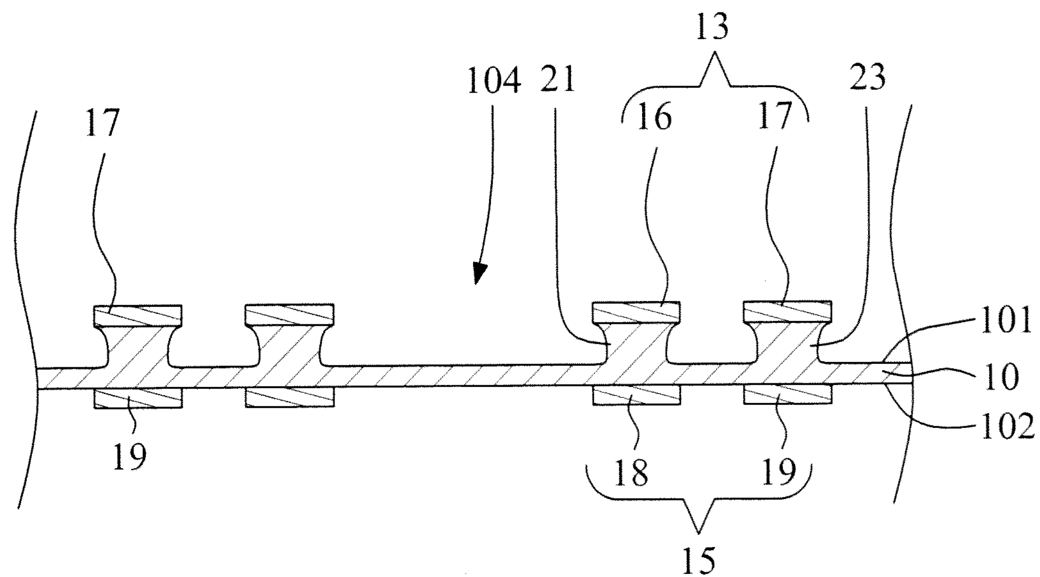

With reference to FIG. 7, a half etching process using the upper metal layer 13 as a mask is performed on the upper surface 101 of the core 10 so as to form a central protrusion 21 and a plurality of peripheral protrusions 23. That is, the half etching process is performed on the upper surface 101 of the core 10 in areas without the upper metal layer 13 formed thereon. The central protrusion 21 extends upwardly from the core 10 so as to define a cavity 104. Each of the peripheral protrusions 23 extends upwardly from the core 10, and is disposed around the central protrusion 21. The first upper metal portion 16 remains on the central protrusion 21, and the second upper metal portions 17 remain on the peripheral protrusions 23.

Figure 8:
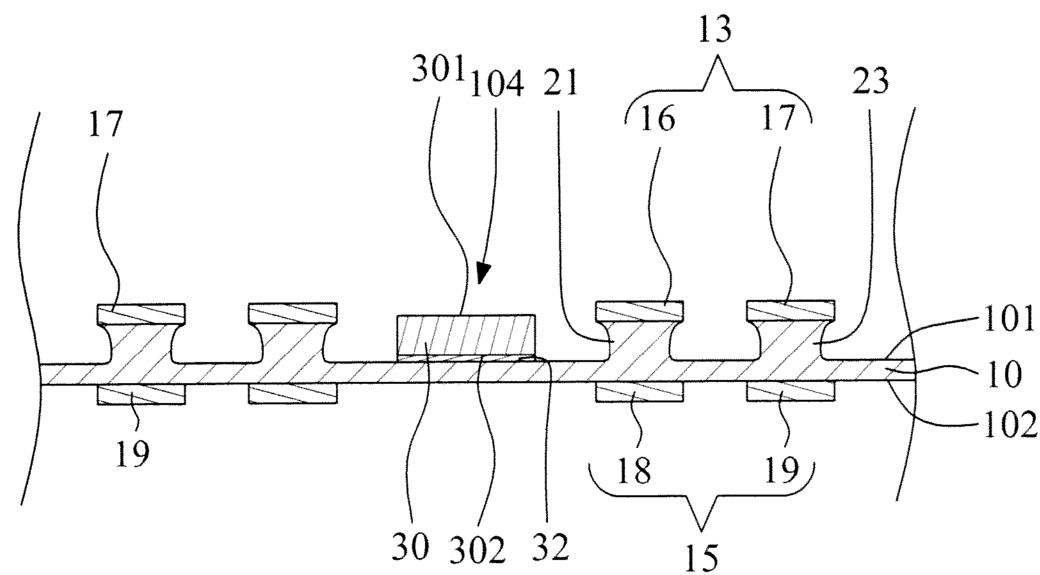

With reference to FIG. 8, the light-emitting device 30 is attached to the bottom of the cavity 104 with an adhesive layer 32. The adhesive layer 32 may be a conductive or a non-conductive adhesive material. For example, the adhesive layer 32 may be silver paste or non-conductive epoxy. The light-emitting device 30 has an upper light-emitting surface 301 facing upwardly and a lower light-emitting surface 302 facing downwardly. In the illustrated embodiment, the light-emitting device 30 is a light-emitting diode (LED).

Figure 9:
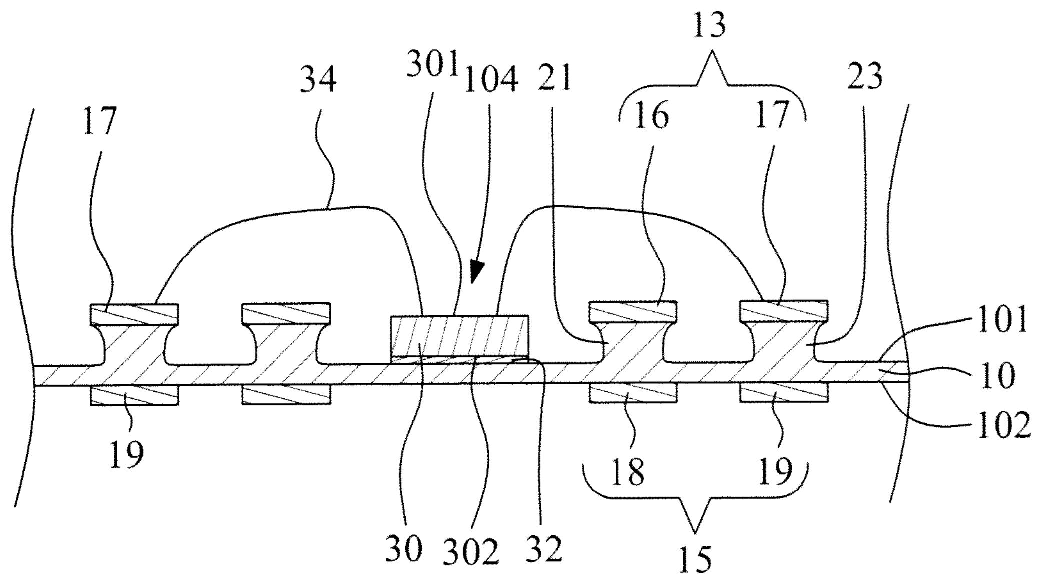
Figure 10:
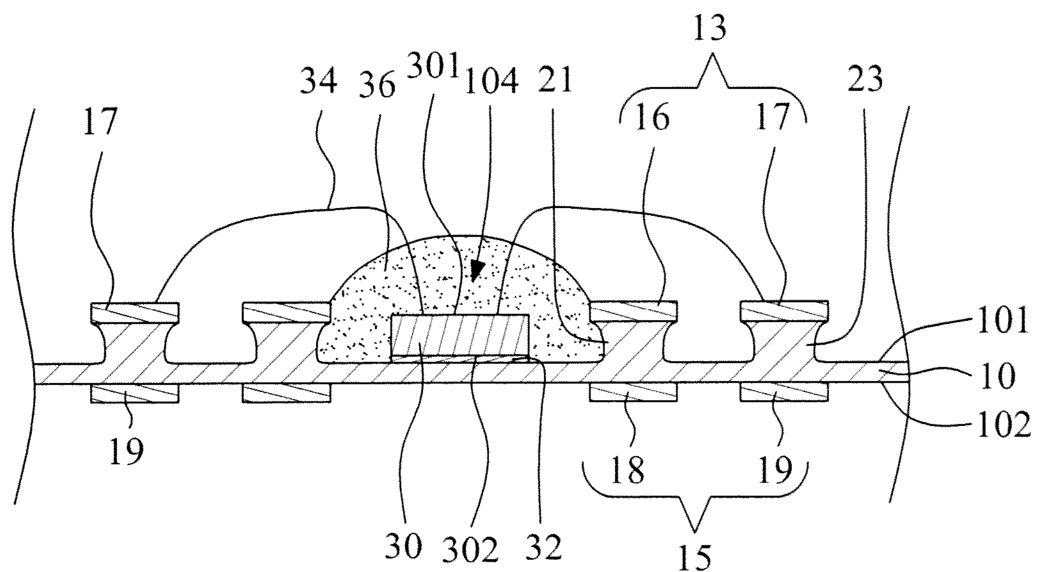

With reference to FIG. 9, the upper light-emitting surface 301 of the light-emitting device 30 is electrically connected to the peripheral protrusions 23 by the bonding wires 34. While not shown, the upper light-emitting surface 301 of the light-emitting device 30 may also be electrically connected to the central protrusion 21 by the bonding wires 34. With reference to FIG. 10, the first encapsulant 36 is formed in the cavity 104 to cover the upper light-emitting surface 301 (i.e., the top surface) of the light-emitting device 30 and the first portions of the bonding wires 34.

Figure 11:
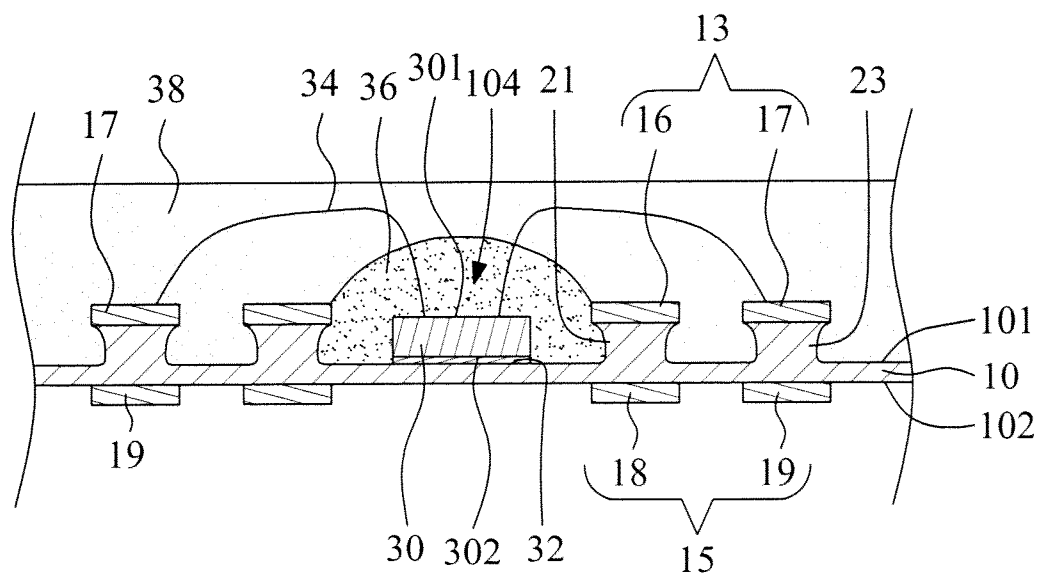
Figure 12:
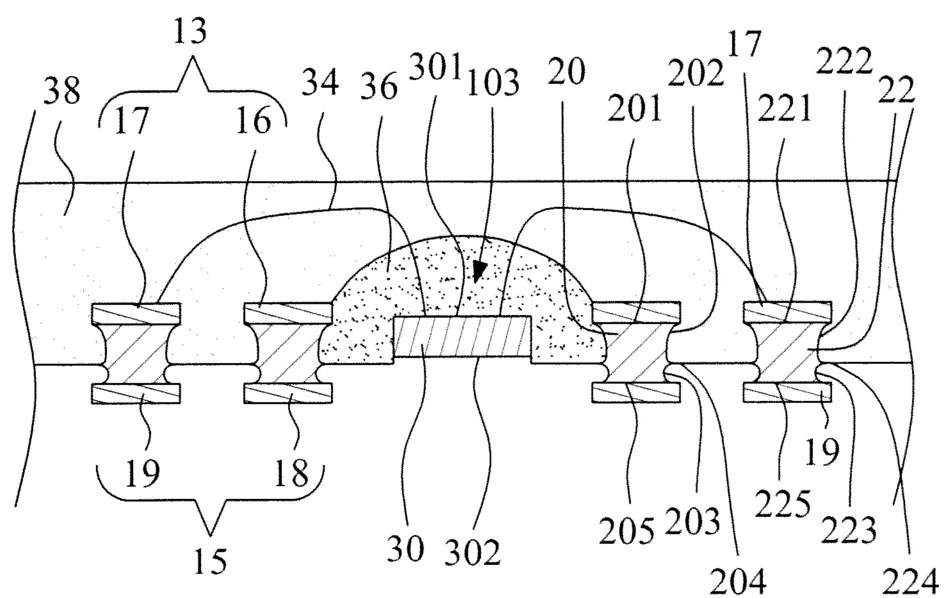

With reference to FIG. 11, the package body 38 is formed over the core 10 so as to cover portions of the bonding wires 34, the first encapsulant 36, the central protrusion 21, and the peripheral protrusions 23. With reference to FIG. 12, the lower surface 102 of the core 10 is etched using the lower metal layer 15 as a mask so as to form the central barrier 20 and the plurality of leads 22. That is, areas on the lower surface 102 of the core 10 not covered by the lower metal layer 15 are etched. The first encapsulant 36 and the adhesive material 32 are preferably made of an etch-resistant material (e.g., a silicon-based material) so that these portions protect the light-emitting device 30 during the etching step. Then, after etching, the adhesive material 32 is removed by a suitable reagent, so that the lower light-emitting surface 302 of the light-emitting device 30 is exposed. Thus, the lower surface of the first encapsulant 36 is recessed from the lower light-emitting surface 302. After the etching process, the portion of the core 10 that is below the cavity 104 is removed so that the cavity 104 becomes the interior space 103. Similarly, portions of the core 10 on either side of the leads 22 are removed so that the leads 22 are electrically isolated from one another and from the central barrier 20. The central barrier 20 corresponds to the first upper metal portion 16 and the first lower metal portion 18, and the leads 22 correspond to the second upper metal portions 17 and the second lower metal portions 19.

The central barrier 20 includes the upper surface 201, the upper sloped portion 202, the lower sloped portion 203, the peak 204, and the lower surface 205. The leads 22 surround the central barrier 20, and are electrically isolated from each other. In the illustrated embodiment, each of the leads 22 includes the upper surface 221, the upper sloped portion 222, the lower sloped portion 223, the peak 224, and the lower surface 225. In the illustrated embodiment, the upper sloped portion 202 of the central barrier 20 and the upper sloped portions 222 of the leads 22 are embedded in the package body 38, and the lower sloped portion 203 of the central barrier 20 and the lower sloped portions 223 of the leads 22 protrude from the package body 38.

Figure 13:
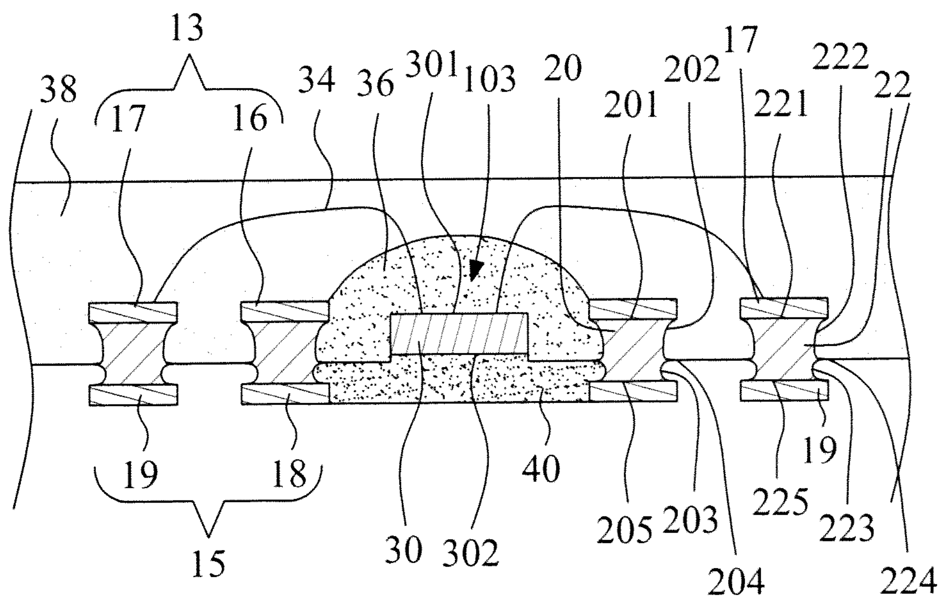

With reference to FIG. 13, the second encapsulant 40 is formed in the interior space 103 to cover the lower light-emitting surface 302 of the light-emitting device 30. In the illustrated embodiment, the second encapsulant 40 fills the space bounded by the lower sloped portion 203 of the central barrier 20, the first encapsulant 36, and the light-emitting device 30, so that the second encapsulant 40 contacts the first encapsulant 36 and the lower light-emitting surface 302 of the light-emitting device 30. Lastly, a singulation process, such as sawing, is performed to obtain the light-emitting semiconductor package 1 shown in FIG. 1.

Figure 14:
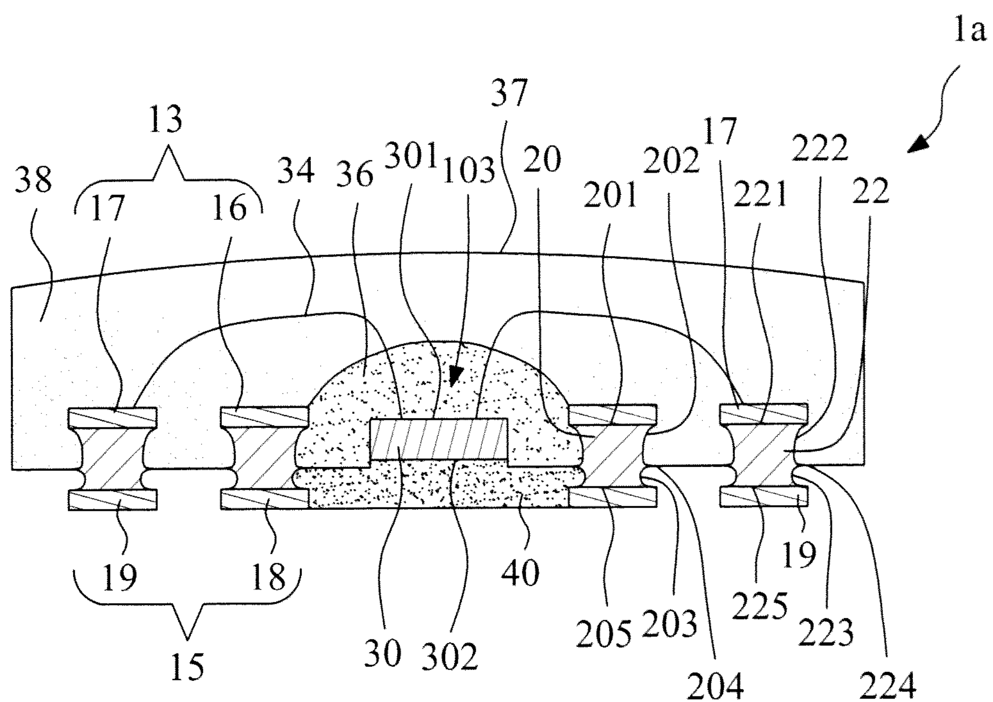
FIG. 14 is a cross-sectional side view of a light-emitting semiconductor package according to another of the present embodiments.

Referring to FIG. 14, a cross-sectional view of a light-emitting semiconductor package according to another of the present embodiments is illustrated. The light-emitting semiconductor package 1 a of this embodiment is substantially similar to the light-emitting semiconductor package 1 of FIGS. 1-3, and the same elements are designated with the same reference numerals. However, in the light-emitting semiconductor package 1*a* of FIG. 14 the package body 38 has a curved top surface 37, whereas the top surface 39 of the package body 38 of the light-emitting semiconductor package 1 of FIG. 1 is flat. In the illustrated embodiment, the top surface 37 is convex. In alternative embodiments, however, the top surface 37 may be concave.

Figure 15:
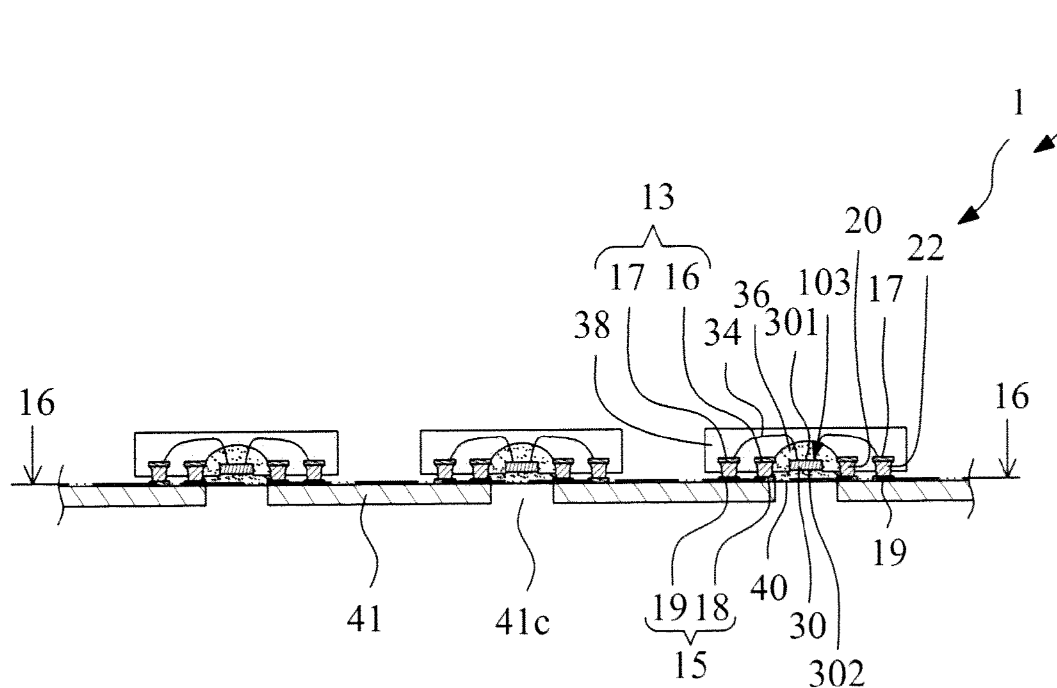
FIG. 15 is a cross-sectional side view of a light-emitting module according to one of the present embodiments.
Figure 16:
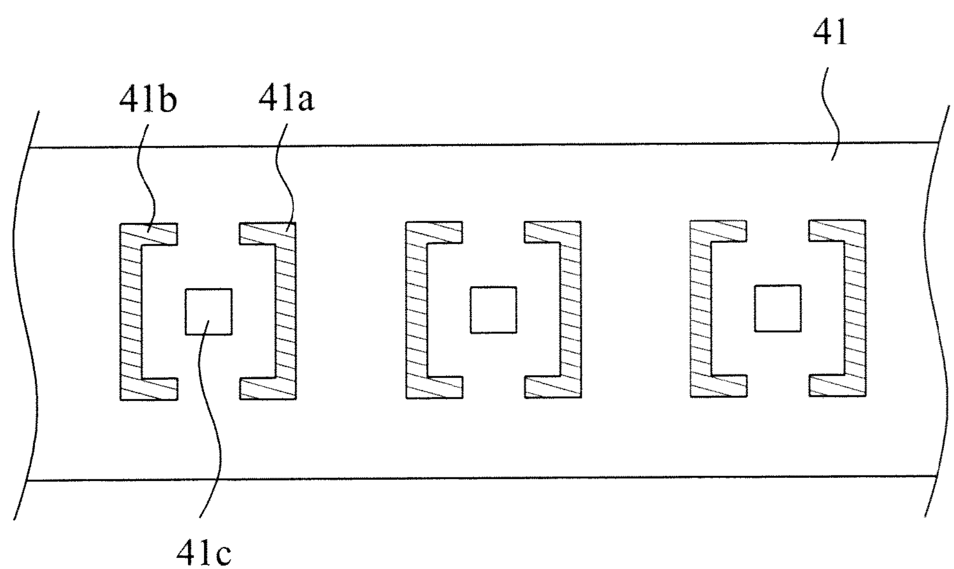
FIG. 16 is a top plan view of the substrate of FIG. 15.

Referring to FIG. 15. a light-emitting module 4 according to one of the present embodiments is shown including several light-emitting semiconductor packages 1 of FIG. 1 mounted on a substrate 41. Referring to FIG. 16, a top view of the substrate 41 is illustrated. The substrate 41 has at least one first electrode 41*a*. at least one second electrode 41*b*. and at least one through hole 41*c*. In the illustrated embodiment, the substrate 41 is a printed circuit board that is opaque, thus the through hole 41*c* is necessary to enable light emitted from the lower light-emitting surface 302 to be visible. However, in other embodiments, the substrate 41 may be a glass plate that is transparent, thus the through hole 41*c* may be omitted.

The leads 22 are electrically connected to the at least one first electrode 41*a* and the at least one second electrode 41*b* of the substrate 41. In the illustrated embodiment, the second lower metal portions 19 are connected to the first electrode 41*a* and the second electrode 41*b*, respectively. One of the first electrode 41*a* and the second electrode 41*b* is a grounding electrode, and the other is a power electrode. The second encapsulant 40 corresponds to the through hole 41*c* so that the light from the lower light-emitting surface 302 of the light-emitting device 30 can pass through the through hole 41*c*.

Figure 17:
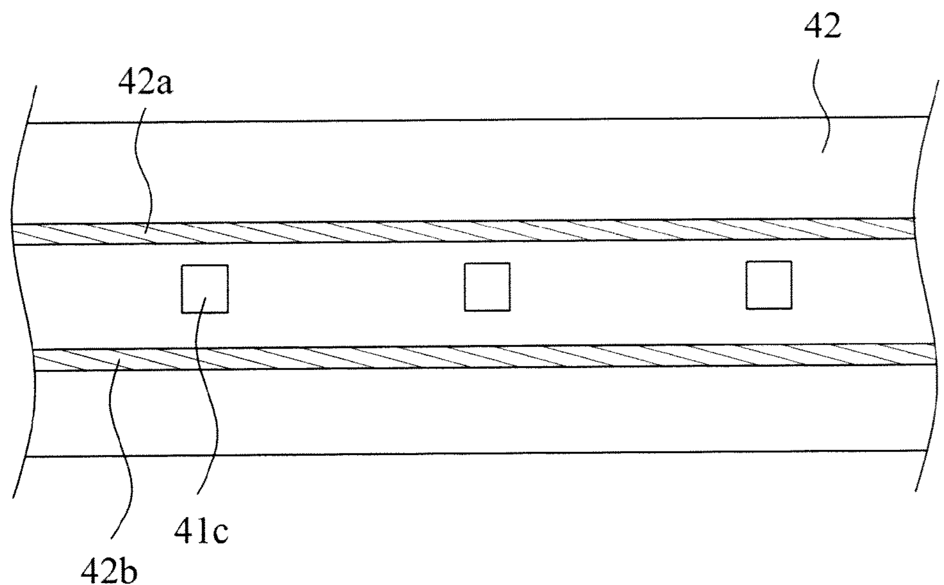
FIG. 17 is a top plan view of a substrate of the light-emitting module according to another of the present embodiments.

Referring to FIG. 17, a top view of a substrate suitable for use in the light-emitting module according to another of the present embodiments is illustrated. The substrate 42 of this embodiment is substantially similar to the substrate 41 of FIG. 16, and the same elements are designated with same reference numerals. The difference between the substrate 42 of this embodiment and the substrate 41 of FIG. 16 is in the structure of the electrode. In FIG. 17, the substrate 42 has a first electrode 42*a* and a second electrode 42*b*. Each of the first electrode 42*a* and the second electrode 42*b* is shaped as a straight line. The second lower metal portions 19 are connected to the first electrode 42*a* and the second electrode 42*b*, respectively. One of the first electrode 42*a* and the second electrode 42*b* is a grounding electrode, and the other is a power electrode. The orientation of the light-emitting semiconductor package 1 on the substrate 42 may be different from the orientation of the light-emitting semiconductor package 1 on the substrate 41. Specifically, the light-emitting semiconductor package 1 on the substrate 41 may be rotated 90° as compared to the light-emitting semiconductor package 1 on the substrate 42.

Figure 18:
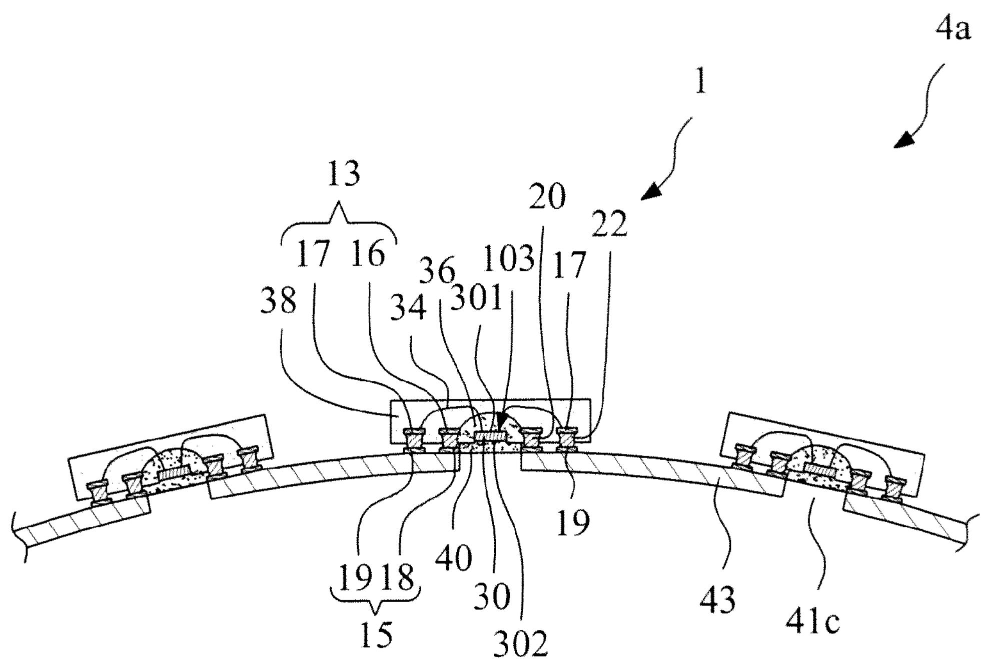
FIG. 18 is a cross-sectional side view of a light-emitting module according to another of the present embodiments.

Referring to FIG. 18, a cross-sectional view of a light-emitting module according to another of the present embodiments is illustrated. The light-emitting module 4*a* of this embodiment is substantially similar to the light-emitting module 4 of FIG. 15 except that the substrate 43 is flexible such that it may be mounted on a curved surface (not shown).

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A light-emitting semiconductor package, comprising:

a central barrier defining an interior space;

a plurality of leads surrounding the central barrier, and electrically isolated from each other;

a light-emitting device disposed in the interior space and having an upper light-emitting surface and a lower light-emitting surface, the light-emitting device being electrically connected to the plurality of leads;

a first encapsulant covering the upper light-emitting surface of the light-emitting device;

a package body encapsulating portions of the central barrier, portions of each of the plurality of leads, and the first encapsulant; and a second encapsulant, covering the lower light-emitting surface of the light-emitting device, wherein light emitted from the lower light-emitting surface of the light-emitting device is capable of passing through the second encapsulant;

wherein portions of the first and second encapsulants are located within the interior space and laterally restricted by the central barrier, wherein side portions of the central barrier and the plurality of leads each include an upper sloped portion, a lower sloped portion, and peaks at a junction of the upper and lower sloped portions, and the first encapsulant contacts the second encapsulant near the peaks of the plurality of leads within the interior space.

2. The light-emitting semiconductor package of claim 1, wherein the first and second encapsulants each contain particles of a light-converting substance.

3. The light-emitting semiconductor package of claim 2, wherein a volume percentage of the light-converting substance in the first encapsulant is less than that in the second encapsulant.

4. The light-emitting semiconductor package of claim 1, wherein the upper and lower sloped portions are concave, the upper sloped portions receive the first encapsulant, and the lower sloped portions receive the second encapsulant.

5. The light-emitting semiconductor package of claim 1, wherein the lower light-emitting surface of the light-emitting device is recessed beneath a lower surface of the first encapsulant.

6. The light-emitting semiconductor package of claim 1, wherein bond wires electrically connect the light-emitting device to the plurality of leads, and the bond wires are partially encapsulated by the first encapsulant and partially encapsulated by the package body.

7. A light-emitting semiconductor package, comprising:

a plurality of leads;

a light-emitting device having an upper light-emitting surface and a lower light-emitting surface, the light-emitting device being electrically connected to the plurality of leads;

a first encapsulant covering the upper light-emitting surface of the light-emitting device;

a package body; and a second encapsulant covering the lower light-emitting surface of the light- emitting device, wherein light emitted from the lower light-emitting surface of the light-emitting device is capable of passing through the second encapsulant, wherein side portions of the plurality of leads each include an upper sloped portion, a lower sloped portion, and peaks at a junction of the upper and lower sloped portions, and the first encapsulant contacts the second encapsulant near the peaks within an interior space.

8. The light-emitting semiconductor package of claim 7, wherein the first and second encapsulants each contain particles of a light-converting substance.

9. The light-emitting semiconductor package of claim 7, further comprising a central barrier defining the interior space, and the light-emitting device disposed in the interior space.

10. The light-emitting semiconductor package of claim 7, wherein the upper and lower sloped portions are concave, the upper sloped portions receive the first encapsulant, and the lower sloped portions receive the second encapsulant.

11. A light-emitting semiconductor package, comprising:

a central barrier defining an interior space;

a plurality of leads surrounding the central barrier, and electrically isolated from each other;

a light-emitting device disposed in the interior space and having an upper light-emitting surface and a lower light-emitting surface, the light-emitting device being electrically connected to the plurality of leads;

a first encapsulant covering the upper light-emitting surface of the light-emitting device;

a package body encapsulating portions of the central barrier, portions of each of the plurality of leads, and the first encapsulant; and a second encapsulant, laterally supported by a portion of the central barrier, covering the lower light-emitting surface of the light-emitting device, wherein light emitted from the lower light-emitting surface of the light-emitting device is capable of passing through the second encapsulant, wherein the second encapsulant is uncovered at a surface of the second encapsulant opposite to the lower light-emitting surface of the light-emitting device;

wherein portions of the first and second encapsulants are located within the interior space and laterally restricted by the central barrier.

12. The light-emitting semiconductor package of claim 11, wherein the first and second encapsulants each contain particles of a light-converting substance.

13. The light-emitting semiconductor package of claim 12, wherein a volume percentage of the light-converting substance in the first encapsulant is less than that in the second encapsulant.

14. The light-emitting semiconductor package of claim 11, wherein side portions of the central barrier and the plurality of leads each include an upper sloped portion, a lower sloped portion, and peaks at a junction of the upper and lower sloped portions.

15. The light-emitting semiconductor package of claim 14, wherein the upper and lower sloped portions are concave, the upper sloped portions receive the first encapsulant, and the lower sloped portions receive the second encapsulant.

16. The light-emitting semiconductor package of claim 14, wherein the first encapsulant contacts the second encapsulant near the peaks of the plurality of leads within the interior space.

17. The light-emitting semiconductor package of claim 11, wherein the lower light-emitting surface of the light-emitting device is recessed beneath a lower surface of the first encapsulant.

18. The light-emitting semiconductor package of claim 11, wherein bond wires electrically connect the light-emitting device to the plurality of leads, and the bond wires are partially encapsulated by the first encapsulant and partially encapsulated by the package body.

19. The light-emitting semiconductor package of claim 11, wherein the light passing through the second encapsulant is unblocked.

* * * * *